(12) United States Patent
Du et al.

(10) Patent No.: US 12,063,839 B2
(45) Date of Patent: Aug. 13, 2024

(54) DISPLAY SUBSTRATE, DISPLAY APPARATUS, AND DISPLAY SUBSTRATE MANUFACTURE METHOD

(71) Applicant: BOE TECHNOLOGY GROUP CO., LTD., Beijing (CN)

(72) Inventors: Shuang Du, Beijing (CN); Paoming Tsai, Beijing (CN); Zhao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 425 days.

(21) Appl. No.: 17/594,057

(22) PCT Filed: Dec. 15, 2020

(86) PCT No.: PCT/CN2020/136447
§ 371 (c)(1),
(2) Date: Sep. 30, 2021

(87) PCT Pub. No.: WO2022/126365
PCT Pub. Date: Jun. 23, 2022

(65) Prior Publication Data
US 2022/0406857 A1   Dec. 22, 2022

(51) Int. Cl.
*H10K 59/50*       (2023.01)
*G02F 1/1335*      (2006.01)
(Continued)

(52) U.S. Cl.
CPC ....... *H10K 59/50* (2023.02); *G02F 1/133512* (2013.01); *G02F 1/133514* (2013.01);
(Continued)

(58) Field of Classification Search
CPC .. H10K 50/865; H10K 59/12; H10K 59/1201; H10K 59/38; H10K 59/50;
(Continued)

(56) References Cited

U.S. PATENT DOCUMENTS

2008/0278792 A1   11/2008   Jang et al.
2011/0256673 A1*  10/2011   Yamazaki .............. H10B 41/30
                                                         438/161
(Continued)

FOREIGN PATENT DOCUMENTS

CN        101303503 A     11/2008
CN        103529615 A      1/2014
(Continued)

*Primary Examiner* — Brook Kebede
(74) *Attorney, Agent, or Firm* — McCoy Russell LLP

(57) ABSTRACT

This disclosure relates to a display substrate. The display substrate includes: a backplate, and a light-emitting device and a thin film encapsulation layer which are successively formed on the backplate, wherein the backplate includes a display area, the display area includes a plurality of pixel areas arranged in an array; the display substrate further includes an electrochromic unit arranged on a side, away from the backplate, of the thin film encapsulation layer, wherein the electrochromic unit includes at least a first area, and projection of the first area onto the backplate covers the pixel areas; the electrochromic unit is in a transparent state when the light-emitting device emits light, and the electrochromic unit is in a black state when the light-emitting device does not emit light. This disclosure also relates to a display apparatus and a display substrate manufacture method.

13 Claims, 1 Drawing Sheet

(51) Int. Cl.
  *G02F 1/13357* (2006.01)
  *G02F 1/1516* (2019.01)
  *G02F 1/153* (2006.01)
  *G02F 1/157* (2006.01)
  *H10K 50/86* (2023.01)
  *H10K 71/00* (2023.01)
  *G02F 1/1524* (2019.01)
  *H10K 59/12* (2023.01)
  *H10K 59/38* (2023.01)

(52) U.S. Cl.
  CPC ........ *G02F 1/1336* (2013.01); *G02F 1/15165* (2019.01); *G02F 1/1533* (2013.01); *G02F 1/157* (2013.01); *H10K 50/865* (2023.02); *H10K 71/00* (2023.02); *G02F 1/1524* (2019.01); *G02F 2201/52* (2013.01); *G02F 2203/64* (2013.01); *H10K 59/12* (2023.02); *H10K 59/1201* (2023.02); *H10K 59/38* (2023.02)

(58) Field of Classification Search
  CPC .............. H10K 71/00; G02F 1/133512; G02F 1/133514; G02F 1/1336; G02F 1/15165; G02F 1/1533; G02F 1/157; G02F 1/1524; G02F 2201/52; G02F 2203/64
  See application file for complete search history.

(56) References Cited

U.S. PATENT DOCUMENTS

| | | | |
|---|---|---|---|
| 2012/0320012 A1* | 12/2012 | Tamaki | G02F 1/13473 345/205 |
| 2016/0033842 A1 | 2/2016 | Shi et al. | |
| 2016/0231636 A1 | 8/2016 | Biver et al. | |
| 2016/0349589 A1 | 12/2016 | Sun et al. | |
| 2017/0174983 A1 | 6/2017 | Odeh et al. | |

FOREIGN PATENT DOCUMENTS

| | | | | | |
|---|---|---|---|---|---|
| CN | 104834146 A | | 8/2015 | | |
| CN | 104952908 A | | 9/2015 | | |
| CN | 105278199 A | * | 1/2016 | | |
| CN | 105278199 A | | 1/2016 | | |
| CN | 105579549 A | | 5/2016 | | |
| CN | 106164213 A | | 11/2016 | | |
| CN | 108987451 A | | 12/2018 | | |
| CN | 208766428 U | | 4/2019 | | |
| CN | 110518148 A | | 11/2019 | | |
| CN | 111048565 A | * | 4/2020 | ............. | G02F 1/155 |
| JP | 2008261981 A | | 10/2008 | | |
| JP | 2015022107 A | | 2/2015 | | |
| WO | 2018152250 A1 | | 8/2018 | | |

* cited by examiner

DISPLAY SUBSTRATE, DISPLAY APPARATUS, AND DISPLAY SUBSTRATE MANUFACTURE METHOD

CROSS REFERENCE TO RELATED APPLICATIONS

The present application is a U.S. National Phase of International Application No. PCT/CN2020/136447 entitled "DISPLAY SUBSTRATE, DISPLAY APPARATUS, AND DISPLAY SUBSTRATE MANUFACTURE METHOD," and filed on Dec. 15, 2020. The entire contents of each of the above-listed application is hereby incorporated by reference for all purposes.

TECHNICAL FIELD

The present disclosure relates to the field of display product manufacturing technologies, and more particularly, to a display substrate, a display apparatus and a display substrate manufacture method.

BACKGROUND

In order to improve color gamut of an organic light-emitting diode (OLED) display screen and reduce power consumption, it is common to fabricate on the OLED an RGB color film in place of a polarizer to reduce the reflectivity. An OLED substrate generally includes a backplate, and a circuit layer, a planarization layer and an OLED device which are arranged on the backplate. Because the planarization layer on the backplate needs to be provided with a via hole to implement an electrical connection between the OLED device and the circuit layer, the planarization layer cannot be completely flat, resulting in that the anode in the OLED device cannot be completely flat as well. In a screen off state, when ambient light is incident on pixels of different colors, the reflected light is in different directions. After passing through the color film, the reflected light in different directions has different colors, resulting in a color separation problem.

SUMMARY

An embodiment of the present disclosure provides: a display substrate includes a backplate, and a light-emitting device and a thin film encapsulation layer which are successively formed on the backplate, wherein the backplate includes a display area, the display area includes a plurality of pixel areas arranged in an array, and the display substrate further includes an electrochromic unit arranged on a side, away from the backplate, of the thin film encapsulation layer, and the electrochromic unit includes at least a first area, the projection of the first area onto the backplate covers the plurality of pixel areas; and the electrochromic unit is in a transparent state when the light-emitting device emits light, and the electrochromic unit is in a black state when the light-emitting device does not emit light.

Optionally, the electrochromic unit includes a first transparent conductive layer, an electrochromic layer, an electrolyte layer, an ion storage layer, and a second transparent conductive layer which are disposed sequentially in a direction away from the backplate.

Optionally, the display substrate further includes a color film layer and a black matrix layer which are arranged on a side, away from the backplate, of the thin film encapsulation layer, wherein the color film layer includes color filter layers corresponding to the plurality of pixel areas in a one-to-one manner, the black matrix layer has a plurality of openings arranged at intervals, the plurality of color filter layers are positioned at the openings, and the color filter layers are added with an electrochromic material to be reused as the electrochromic layer.

Optionally, the color film layer and the black matrix layer are located between the first transparent conductive layer and the second transparent conductive layer.

Optionally, the electrochromic material includes at least one of polythiophenes and derivatives thereof, viologens, or metal phthalocyanines.

Optionally, the color filter layers include red filter layers, green filter layers and blue filter layers.

Optionally, an orthographic projection of the electrochromic layer onto the backplate completely covers the display area of the backplate.

Optionally, the display substrate further includes a color film layer and a black matrix layer which are arranged on a side, away from the backplate, of the thin film encapsulation layer, wherein the color film layer includes color filter layers corresponding to the plurality of pixel areas in a one-to-one manner, the black matrix layer has a plurality of openings arranged at intervals, and the plurality of color filter layers are positioned at the openings, the color film layer and the black matrix layer are located on a side, close to the backplate, of the first transparent conductive layer.

Optionally, the light-emitting device includes an anode, a light-emitting layer and a cathode which are sequentially arranged in a direction away from the backplate.

Another embodiment of the present disclosure further provides a display apparatus including the aforementioned display substrate.

An embodiment of the present disclosure provides a display substrate manufacture method. The method is applied to the above-mentioned display substrate, and includes the following steps:
  providing a backplate having a thin film transistor circuit layer;
  forming a light-emitting device on the backplate;
  forming a thin film encapsulation layer on a side, away from the backplate, of the light-emitting device;
  forming an electrochromic unit on a side, away from the backplate, of the thin film encapsulation layer.

Optionally, the forming the electrochromic unit on the side, away from the backplate, of the thin film encapsulation layer includes: forming a first transparent conductive layer, an electrochromic layer, an electrolyte layer, an ion storage layer and a second transparent conductive layer successively on the thin film encapsulation layer in a direction away from the backplate.

Optionally, the forming the electrochromic unit on the side, away from the backplate, of the thin film encapsulation layer specifically includes:
  dissolving an electrochromic polymer in a toluene solvent in a mass ratio of 1:4 to obtain an electrochromic solvent;
  forming a black matrix layer on the first transparent conductive layer;
  adding the electrochromic solvent to a color filter material and mixing to form a mixed material, and applying the mixed material at an opening of the black matrix to form the electrochromic layer.

Optionally, the forming the electrochromic unit on a side, away from the backplate, of the thin film encapsulation layer specifically includes:

dissolving an electrochromic polymer in a toluene solvent in a mass ratio of 1:4 to obtain an electrochromic solvent;

applying the electrochromic solvent integrally on the first transparent conductive layer to form the electrochromic layer.

DETAILED DESCRIPTION

Figure 1:
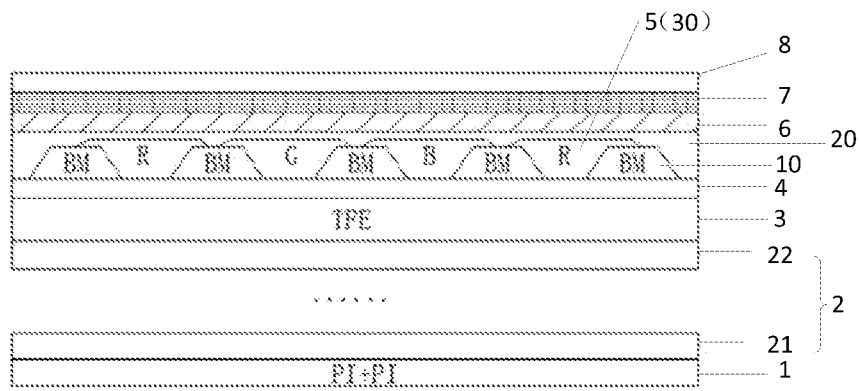
FIG. 1 is a first schematic structural diagram of a display substrate provided in an embodiment of the present disclosure.

To further clarify the objectives, features and advantages of the embodiments of the present disclosure, the technical solutions in the embodiments of the present disclosure will be clearly described below with reference to the drawings in the present disclosure. Obviously, the embodiments described in the present disclosure are part of the embodiments rather than all embodiments of the disclosure. All other embodiments obtained by those of ordinary skill in the art on the basis of the described embodiments of the present disclosure shall fall within the scope of the present disclosure.

In the description of the present disclosure, it should be understood that the orientation or positional relationship indicated by the terms "center", "upper", "lower", "left", "right", "vertical", "horizontal", "inner", "outer", and the like is orientation or positional relationship shown in the drawings, and is adopted not to indicate or imply that indicated devices or components must be in specific orientations or must be structured and operated in specific orientations, but only to conveniently describe the present disclosure and simplify descriptions. Thus, it should not be construed as limitations on the present disclosure. Furthermore, the terms "first", "second", and "third" are used for descriptive purposes only and are not to be construed as indicating or implying relative importance.

Figure 2:
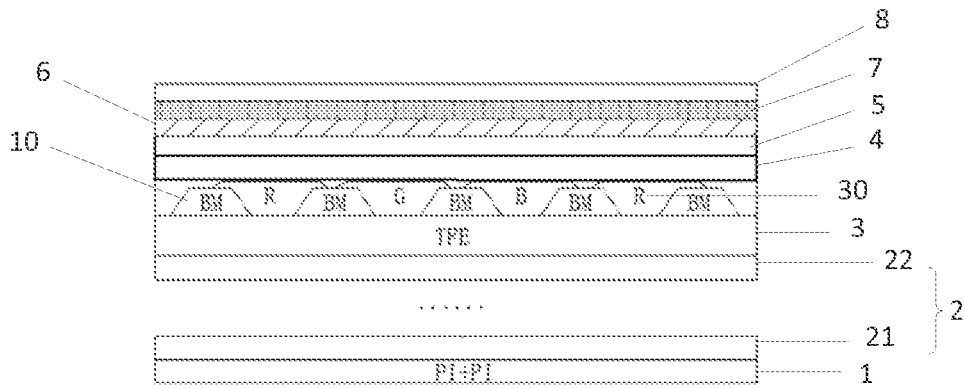
FIG. 2 is a second schematic structural diagram of a display substrate provided in an embodiment of the present disclosure.

As shown in FIG. 1 and FIG. 2, this embodiment provides a display substrate. The display substrate includes a backplate 1, and includes a light-emitting device 2 and a thin film encapsulation layer 3 which are successively formed on the backplate 1. The backplate 1 includes a display area, the display area includes a plurality of pixel areas arranged in an array. The display substrate further includes an electrochromic unit arranged on a side, away from the backplate 1, of the thin film encapsulation layer 3. The electrochromic unit includes at least a first area, and a projection of the first area onto the backplate 1 covers the plurality of pixel areas.

When the light-emitting device 2 emits light, the electrochromic unit is in a transparent state, and when the light-emitting device 2 does not emit light, the electrochromic unit is in a black state.

When the light-emitting device emits light, the electrochromic unit is in a transparent state, thus the normal display of the display substrate is not affected. When the light-emitting device 2 does not emit light, namely, when the display substrate is in a screen off state, the electrochromic unit is in a black state, thereby preventing ambient light from being incident on a metal electrode layer (e.g., an anode) of the light-emitting device 2 and being reflected, thus a color separation phenomenon is avoided.

In the present embodiment, for example, light transmittance of the electrochromic unit is greater than 92% when the electrochromic unit is in a transparent state, and less than 5% when the electrochromic unit is in a black state.

In the present embodiment, for example, the electrochromic unit includes a first transparent conductive layer 4, an electrochromic layer 5, an electrolyte layer 6, an ion storage layer 7 and a second transparent conductive layer 8 which are sequentially arranged in a direction away from the backplate 1.

In the present embodiment, for example, the electrolyte layer 6 has a thickness of 0.05 um to 0.2 um.

In the present embodiment, for example, the electrolyte layer 6 is made of a solid or gel state polymer electrolyte material, and particularly, the electrolyte layer 6 may be made of polymethyl methacrylate.

In the present embodiment, for example, the ion storage layer 7 has a thickness of 0.05 um to 0.2 um.

In the present embodiment, for example, the ion storage layer 7 is made of titanium dioxide.

In the present embodiment, for example, the first transparent conductive layer 4 and the second transparent conductive layer 8 do not have a light transmittance of 100%, and the first transparent conductive layer 4 and the second transparent conductive layer 8 are considered transparent when the light transmittance falls within a certain range (for example, greater than 92%). In the present embodiment, for example, the first transparent conductive layer 4 and the second transparent conductive layer 8 may be made of indium tin oxide (ITO).

In the present embodiment, for example, the display substrate further includes a color film layer 30 and a black matrix layer which are arranged on a side, away from the backplate 1, of the thin film encapsulation layer 3. The color film layer 30 includes a plurality of color filter layers corresponding to the plurality of pixel areas in a one-to-one manner, the black matrix layer has a plurality of openings arranged at intervals, and the plurality of color filter layers are positioned at the openings, the color filter layers are added with an electrochromic material to be reused as the electrochromic layer 5.

Figure 3:
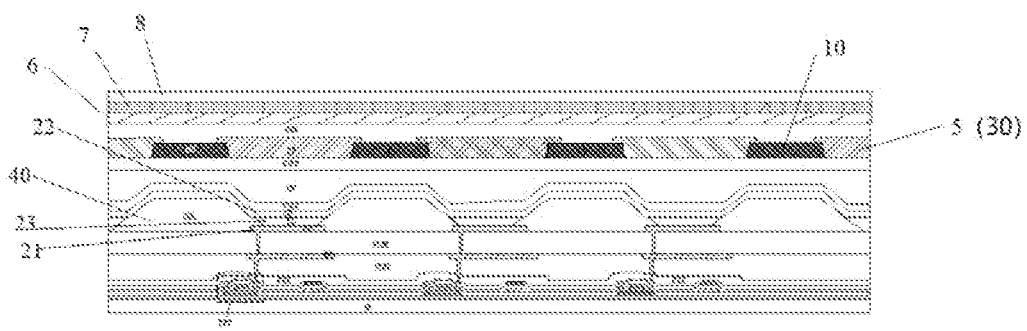
FIG. 3 is a third schematic structural diagram of a display substrate provided in an embodiment of the present disclosure.

It should be noted that the pixel areas are light-emitting areas corresponding to opening positions on a pixel definition layer 40, with reference to FIG. 3.

In the present embodiment, the color film layer 30 and the black matrix layer 10 are located between the first transparent conductive layer 4 and the second transparent conductive layer 8.

In the present embodiment, for example, a planarization layer 20 is arranged between the color film layer 30 and the electrolyte layer 6.

Referring to FIG. 1, in the present embodiment, for example, an electrochromic material is added to the color filter layers to achieve both electrochromism and light filtering function, so that the thickness of a display substrate is reduced.

In the present embodiment, for example, the color filter layers include red filter layers, green filter layers and blue filter layers.

In the present embodiment, for example, the electrochromic layer 5 is integrated with the color filter layers, and the electrochromic material includes at least one of polythiophenes and derivatives of polythiophenes, or viologens, or metal phthalocyanines.

In the present embodiment, for example, the electrochromic material is prepared by dissolving an electrochromic polymer in a toluene solvent in a mass ratio of 1:4, and the electrochromic polymer has the following structural formula:

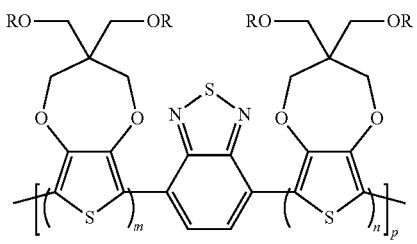

where m, n, p are natural integers selected from a range of 1 to infinity and R is 2-ethylhexyl.

Referring to FIG. 2, in the present embodiment, for example, an orthographic projection of the electrochromic layer 5 onto the backplate 1 completely covers the display area of the backplate 1.

In the present embodiment, the display substrate further includes a color film layer 30 and a black matrix layer 10 which are arranged on a side, away from the backplate, of the thin film encapsulation layer. The color film layer 30 includes color filter layers corresponding to the plurality of pixel areas in a one-to-one manner. The black matrix layer 10 has a plurality of openings arranged at intervals, and the plurality of color filter layers are positioned at the openings. In the implementation shown in FIG. 2, the color film layer 30 and the black matrix layer 10 are located on a side, close to the backplate, of the first transparent conductive layer 4.

In the implementation shown in FIG. 2, the color film layer 30 is located on a side, close to the backplate 1, of the electrochromic unit, but the present disclosure is not limited thereto. The color film layer 30 may also be located on a side, away from the backplate 1, of the electrochromic unit.

The electrochromic layer 5 is provided separately, and is disposed as a whole on a side, away from the backplate 1, of the thin film encapsulation layer 3, thus the process is simplified.

In the present embodiment, for example, the light-emitting device 2 includes an anode 21, a light-emitting layer 23 and a cathode 22 which are sequentially arranged in a direction away from the backplate 1.

In the present embodiment, the display substrate may be an OLED display substrate, but the present disclosure is not limited thereto.

An embodiment of the present disclosure further provides a display apparatus including the aforementioned display substrate.

An embodiment of the present disclosure provides a manufacture method of display substrate, which is applied to the above-mentioned display substrate, and includes the following steps:
  providing a backplate 1 having a thin film transistor circuit layer;
  forming a light-emitting device 2 on the backplate 1;
  forming a thin film encapsulation layer 3 on a side, away from the backplate 1, of the light emitting device 2; and
  forming an electrochromic unit on a side, away from the backplate 1, of the thin film encapsulation layer 3.

In the present embodiment, for example, the forming the electrochromic unit on a side, away from the backplate 1, of the thin film encapsulation layer 3 includes: forming a first transparent conductive layer 4, an electrochromic layer 5, an electrolyte layer 6, an ion storage layer 7 and a second transparent conductive layer 8 sequentially on the thin film encapsulation layer 3 in a direction away from the backplate 1.

In the present embodiment, for example, the forming the electrochromic unit on a side, away from the backplate 1, of the thin film encapsulation layer 3 specifically includes:
  forming the first transparent conductive layer 4;
  dissolving an electrochromic polymer in a toluene solvent in a mass ratio of 1:4 to obtain an electrochromic solvent;
  forming a black matrix layer on the first transparent conductive layer 4;
  adding the electrochromic solvent to a color filter material and mixing to form a mixed material, and applying the mixed material at the opening of the black matrix to form the electrochromic layer 5;
  forming the electrolyte layer 6 by spin coating, spray coating or coating printing; and
  forming the ion storage layer 7 by spin coating, spray coating or coating printing.

In the present embodiment, by using the above-mentioned electrochromic unit, the color change response is fast, and the color change speed is 5 s-30 s. The light transmittance of the electrochromic unit may be reduced to <10% when the electrochromic unit is in a black state. When the electrochromic unit is in a colorless transparent state, the light transmittance of the electrochromic unit can be adjusted to >95%.

In the present embodiment, for example, the electrochromic solvent is mixed with a color filter material in a mix ratio of 1:5 to form a mixed material, but the present disclosure is not limited thereto.

In the present embodiment, for example, the forming the electrochromic unit on the side, away from the backplate 1, of the thin film encapsulation layer 3 specifically includes:
  dissolving an electrochromic polymer in a toluene solvent in a mass ratio of 1:4 to obtain an electrochromic solvent; and
  applying the electrochromic solvent integrally on the first transparent conductive layer 4 to form an electrochromic layer.

In the implementation where the electrochromic layer 5 is provided separately and the electrochromic layer 5 completely covers the first transparent conductive layer 4, the color film layer may be arranged on the side, away from the thin film encapsulation layer 3, of the electrochromic unit, or the color film layer may be arranged between the thin film encapsulation layer 3 and the electrochromic unit.

In the present embodiment, for example, the electrolyte layer is made of polymethyl methacrylate.

The electrochromic material undergoes a redox reaction under a voltage and its color changes; the electrolyte layer provides compensation particles required by the electrochromic material; and the ion storage layer serves to store corresponding counter ions when the electrochromic material undergoes a redox reaction, to maintain the charge balance of the whole system.

The above is only optional embodiments of the disclosure. It should be pointed out that those skilled in the art may further make several improvements and modifications without departing from the principle of the disclosure, and all of these improvements and modifications fall within the scope of the present disclosure.

The invention claimed is:

1. A display substrate, comprising: a backplate, and a light-emitting device and a thin film encapsulation layer which are successively formed on the backplate, wherein the backplate comprises a display area, and the display area comprises a plurality of pixel areas arranged in an array, wherein the display substrate further comprises an electrochromic unit arranged on a side, away from the backplate, of the thin film encapsulation layer, the electrochromic unit comprises at least a first area, and a projection of the first area onto the backplate covers the plurality of pixel areas; and the electrochromic unit is in a transparent state when the light-emitting device emits light, and the electrochromic unit is in a black state when the light-emitting device does not emit light;

wherein the electrochromic unit comprises a first transparent conductive layer, an electrochromic layer, an electrolyte layer, an ion storage layer and a second transparent conductive layer which are arranged sequentially in a direction away from the backplate.

2. The display substrate according to claim 1, further comprising a color film layer and a black matrix layer which are arranged on a side, away from the backplate, of the thin film encapsulation layer, wherein the color film layer comprises a plurality of color filter layers corresponding to the plurality of pixel areas in a one-to-one manner, the black matrix layer has a plurality of openings arranged at intervals, the plurality of color filter layers are positioned at the openings, and the color filter layers are added with an electrochromic material to be reused as the electrochromic layer.

3. The display substrate according to claim 2, wherein the color film layer and the black matrix layer are located between the first transparent conductive layer and the second transparent conductive layer.

4. The display substrate according to claim 2, wherein the electrochromic material comprises at least one of polythiophenes and derivatives thereof, viologens, or metal phthalocyanines.

5. The display substrate according to claim 2, wherein the color filter layers comprise red filter layers, green filter layers and blue filter layers.

6. The display substrate according to claim 1, wherein an orthographic projection of the electrochromic layer onto the backplate completely covers the display area of the backplate.

7. The display substrate according to claim 6, further comprising a color film layer and a black matrix layer which are arranged on a side, away from the backplate, of the thin film encapsulation layer, wherein the color film layer comprises a plurality of color filter layers corresponding to the plurality of pixel areas in a one-to-one manner, the black matrix layer has a plurality of openings arranged at intervals, the plurality of color filter layers are positioned at the openings, and the color film layer and the black matrix layer are located on a side, close to the backplate, of the first transparent conductive layer.

8. The display substrate according to claim 1, wherein the light-emitting device comprises an anode, a light-emitting layer, and a cathode which are sequentially arranged in a direction away from the backplate.

9. The display apparatus, comprising the display substrate according to claim 1.

10. The display substrate manufacture method, applied to the display substrate according to claim 1, comprising:

providing a backplate having a thin film transistor circuit layer;

forming a light-emitting device on the backplate;

forming a thin film encapsulation layer on a side, away from the backplate, of the light-emitting device; and forming an electrochromic unit on a side, away from the backplate, of the thin film encapsulation layer.

11. The display substrate manufacture method according to claim 10, wherein the forming the electrochromic unit on the side, away from the backplate, of the thin film encapsulation layer comprises:

forming a first transparent conductive layer, an electrochromic layer, an electrolyte layer, an ion storage layer and a second transparent conductive layer successively on the thin film encapsulation layer in a direction away from the backplate.

12. The display substrate manufacture method according to claim 11, wherein the forming the electrochromic unit on the side, away from the backplate, of the thin film encapsulation layer specifically comprises:

dissolving an electrochromic polymer in a toluene solvent in a mass ratio of 1:4, to obtain an electrochromic solvent;

forming a black matrix layer on the first transparent conductive layer; and adding the electrochromic solvent to a color filter material and mixing to form a mixed material, and applying the mixed material at an opening of the black matrix to form the electrochromic layer.

13. The display substrate manufacture method according to claim 11, wherein the forming the electrochromic unit on the side, away from the backplate, of the thin film encapsulation layer specifically comprises:

dissolving an electrochromic polymer in a toluene solvent in a mass ratio of 1:4, to obtain an electrochromic solvent; and applying the electrochromic solvent integrally on the first transparent conductive layer to form the electrochromic layer.

* * * * *